United States Patent
Xi

(10) Patent No.: US 11,217,194 B2
(45) Date of Patent: Jan. 4, 2022

(54) ARRAY SUBSTRATE AND DISPLAY PANEL

(71) Applicant: Shenzhen CHINA STAR OPTOELECTRONICS SEMICONDUCTOR DISPLAY TECHNOLOGY CO., LTD., Guangdong (CN)

(72) Inventor: Suping Xi, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 135 days.

(21) Appl. No.: 16/623,258

(22) PCT Filed: Nov. 5, 2019

(86) PCT No.: PCT/CN2019/115810
§ 371 (c)(1),
(2) Date: Dec. 16, 2019

(87) PCT Pub. No.: WO2021/031367
PCT Pub. Date: Feb. 25, 2021

(65) Prior Publication Data
US 2021/0366427 A1  Nov. 25, 2021

(30) Foreign Application Priority Data
Aug. 16, 2019 (CN) .......................... 201910756346.7

(51) Int. Cl.
*G09G 3/36* (2006.01)
*H01L 27/12* (2006.01)

(52) U.S. Cl.
CPC ......... *G09G 3/3677* (2013.01); *H01L 27/124* (2013.01); *H01L 27/1251* (2013.01)

(58) Field of Classification Search
CPC .......................... H01L 27/1251; H01L 27/124
See application file for complete search history.

(56) References Cited

U.S. PATENT DOCUMENTS

| | | | | |
|---|---|---|---|---|
| 9,490,267 B2* | 11/2016 | Fujita | ................... | H01L 27/1222 |
| 9,684,215 B2* | 6/2017 | Umezaki | ........... | G02F 1/136286 |
| 10,943,538 B2* | 3/2021 | Eom | ................... | H01L 27/3279 |
| 2010/0208187 A1 | 8/2010 | Saito et al. | | |
| 2016/0307532 A1* | 10/2016 | Dai | ........................... | G09G 3/36 |
| 2017/0345845 A1 | 11/2017 | Wu et al. | | |
| 2018/0203565 A1 | 7/2018 | Lu et al. | | |
| 2019/0172884 A1* | 6/2019 | Shim | .................... | H01L 27/3272 |
| 2020/0083604 A1* | 3/2020 | Misaki | ..................... | H01Q 3/44 |

FOREIGN PATENT DOCUMENTS

| CN | 104731405 A | 6/2015 |
|---|---|---|
| CN | 105807523 A | 7/2016 |

* cited by examiner

*Primary Examiner* — Vinh T Lam

(57) ABSTRACT

The array substrate comprises: a substrate including a first region, a second region, and a third region; a first metal layer is disposed on the substrate and forms a gate metal and a common line; a first insulating layer is disposed on the substrate and the first metal layer; a second metal layer is disposed on the first insulating layer and forms a source/drain metal; a second insulating layer is disposed on the first insulating layer and the second metal layer; and a third metal layer is disposed on the second insulating layer and forms a voltage signal line.

18 Claims, 2 Drawing Sheets

ARRAY SUBSTRATE AND DISPLAY PANEL

BACKGROUND OF INVENTION

Field of Invention

The present application relates to the display technology, and particularly, to an array substrate and a display panel.

Description of Prior Art

Gate driver on array (GOA) is a method of fabricating a gate row scan driving signal circuit on an array substrate by using an array substrate process in an existing thin film transistor liquid crystal display to realize a gate-by-row scanning driving mode.

GOA technology can achieve narrow borders or even borderless design, which can increase TV customer process design choices and expand product application fields (for example, public splicing display fields). In order to meet the product demand of narrower frame and improve product quality competitiveness and price competitiveness, it is especially necessary to design a new circuit that saves the GOA circuit area.

SUMMARY OF INVENTION

The present application provides an array substrate and a display panel, which can improve the beneficial effect of the screen ratio.

The present application provides an array substrate provided with a gate driver on array (GOA) driving circuit, wherein the GOA driving circuit comprises a plurality of thin film transistors, and the array substrate comprises: a substrate comprising a display region and a non-display region, wherein the non-display region comprises a first region, a second region, and a third region that are sequentially connected side by side, and the first region is located between the second region and the display region; a first metal layer disposed on the substrate and forming a gate metal on the first region and the third region and a common line on the second region, wherein the gate metal comprises gates of the plurality of thin film transistors; a first insulating layer disposed on the substrate and the first metal layer; a second metal layer disposed on the first insulating layer and forming a source and drain metal on the first region and the third region, wherein the source and drain metal comprises sources and drains of the plurality of thin film transistors; a second insulating layer disposed on the first insulating layer and the second metal layer; and a third metal layer disposed on the second insulating layer and forming a plurality of spaced-apart voltage signal lines located above the second region; wherein the voltage signal lines extend in a same direction as the common line, the voltage signal lines are disposed in parallel, and a vertical projection of the voltage signal lines on the substrate is located in the second region; and wherein the first metal layer further forms a plurality of scan lines located in the third region.

In the array substrate of the present application, the plurality of voltage signal lines comprise a low voltage level signal line and a plurality of clock signal lines.

In the array substrate of the present application, a number of the plurality of clock signal lines is four.

In the array substrate of the present application, the plurality of thin film transistors comprise a first thin film transistor, a second thin film transistor, a third thin film transistor, and a fourth thin film transistor; a source of the first thin film transistor is electrically connected to a gate of the second thin film transistor and a drain of the fourth thin film transistor, a gate of the third thin film transistor is electrically connected to a gate of the fourth thin film transistor, a source of the second thin film transistor is electrically connected to a drain of the third thin film transistor, a source of the third thin film transistor, a source of the fourth thin film transistor, and the low level signal line are electrically connected, and a drain of the second thin film transistor is electrically connected to the clock signal lines.

In the array substrate of the present application, the gate, the source, and the drain of the second thin film transistor are located above the first region, and the gate, the source and the drain of the first thin film transistor, the third thin film transistor, and the fourth thin film transistor are located above the third region.

In the array substrate of the present application, the second metal layer further forms a plurality of connection traces and a plurality of connecting metal blocks, each of the connecting metal blocks is respectively disposed above one of the voltage signal lines, and one end of the connection traces is electrically connected to the connecting metal blocks, and another end of the connection traces is electrically connected to the drains; and a first metallized hole disposed on a position of the second insulating layer corresponding to the first connecting metal blocks, and the first metallized hole is used to electrically connect the connecting metal blocks to corresponding voltage signal lines.

In the array substrate of the present application, each of the connecting metal blocks is electrically connected to the corresponding voltage signal lines through the first metallized hole arranged in a plurality of arrays.

The application also provides an array substrate provided with a gate driver on array (GOA) driving circuit, wherein the GOA driving circuit comprises a plurality of thin film transistors, and the array substrate comprises: a substrate comprising a display region and a non-display region, wherein the non-display region comprises a first region, a second region, and a third region that are sequentially connected side by side, and the first region is located between the second region and the display region; a first metal layer disposed on the substrate and forming a gate metal on the first region and the third region and a common line on the second region, wherein the gate metal comprises gates of the plurality of thin film transistors; a first insulating layer disposed on the substrate and the first metal layer; a second metal layer disposed on the first insulating layer and forming a source and drain metal on the first region and the third region, wherein the source and drain metal comprises sources and drains of the plurality of thin film transistors; a second insulating layer disposed on the first insulating layer and the second metal layer; and a third metal layer disposed on the second insulating layer and forming a plurality of spaced-apart voltage signal lines located above the second region.

In the array substrate of the present application, the voltage signal lines extend in a same direction as the common line, the voltage signal lines are disposed in parallel, and a vertical projection of the voltage signal lines on the substrate is located in the second region.

In the darray substrate of the present application, the plurality of voltage signal lines comprise a low level signal line and a plurality of clock signal lines.

In the array substrate of the present application, a number of the plurality of clock signal lines is four.

In the array substrate of the present application, the plurality of thin film transistors comprise a first thin film transistor, a second thin film transistor, a third thin film transistor, and a fourth thin film transistor; a source of the first thin film transistor is electrically connected to a gate of the second thin film transistor and a drain of the fourth thin film transistor, a gate of the third thin film transistor is electrically connected to a gate of the fourth thin film transistor, a source of the second thin film transistor is electrically connected to a drain of the third thin film transistor, a source of the third thin film transistor, a source of the fourth thin film transistor, and the low level signal line are electrically connected, and a drain of the second thin film transistor is electrically connected to the clock signal lines.

In the array substrate of the present application, the gate, the source, and the drain of the second thin film transistor are located above the first region, and the gate, the source and the drain of the first thin film transistor, the third thin film transistor, and the fourth thin film transistor are located above the third region.

In the array substrate of the present application, the second metal layer further forms a plurality of connection traces and a plurality of connecting metal blocks, each of the connecting metal blocks is respectively disposed above one of the voltage signal lines, and one end of the connection traces is electrically connected to the connection metal block, and the other end of the connection trace is electrically connected to a drain; a first metallized hole disposed on a position of the second insulating layer corresponding to the first connecting metal blocks, and the first metallized hole is used to electrically connect the connecting metal blocks to corresponding voltage signal lines.

In the array substrate of the present application, each of the connecting metal blocks is electrically connected to the corresponding voltage signal lines through the first metallized holes arranged in a plurality of arrays.

In the array substrate of the present application, the first metal layer further forms a plurality of scan lines located in the third region.

A display panel comprising an array substrate, the array substrate is provided with a gate driver on array (GOA) driving circuit, the GOA driving circuit comprises a plurality of thin film transistors, and the array substrate comprises: a substrate comprising a display region and a non-display region, wherein the non-display region comprises a first region, a second region, and a third region that are sequentially connected side by side, and the first region is located between the second region and the display region; a first metal layer disposed on the substrate and forming a gate metal on the first region and the third region and a common line on the second region, wherein the gate metal comprises gates of the plurality of thin film transistors; a first insulating layer disposed on the substrate and the first metal layer; a second metal layer disposed on the first insulating layer and forming a source and drain metal on the first region and the third region, wherein the source and drain metal comprises sources and drains of the plurality of thin film transistors; a second insulating layer disposed on the first insulating layer and the second metal layer; and a third metal layer disposed on the second insulating layer and forming a plurality of spaced-apart voltage signal lines located above the second region.

In the display panel of the present application, the voltage signal lines extend in a same direction as the common line, the voltage signal lines are disposed in parallel, and a vertical projection of the voltage signal lines on the substrate is located in the second region.

In the display panel of the present application, the plurality of voltage signal lines comprise a low level signal line and a plurality of clock signal lines.

In the display panel of the present application, a number of the plurality of clock signal lines is four.

In the present application, placing a plurality of voltage signal lines above the region where the common line is located prevents the position in the horizontal direction which is required when the common line and the voltage signal line are disposed on the same layer, thereby reducing the size of the non-display region and improving beneficial effect of screen ratio.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

DETAILED DESCRIPTION OF PREFERRED EMBODIMENTS

Figure 1:
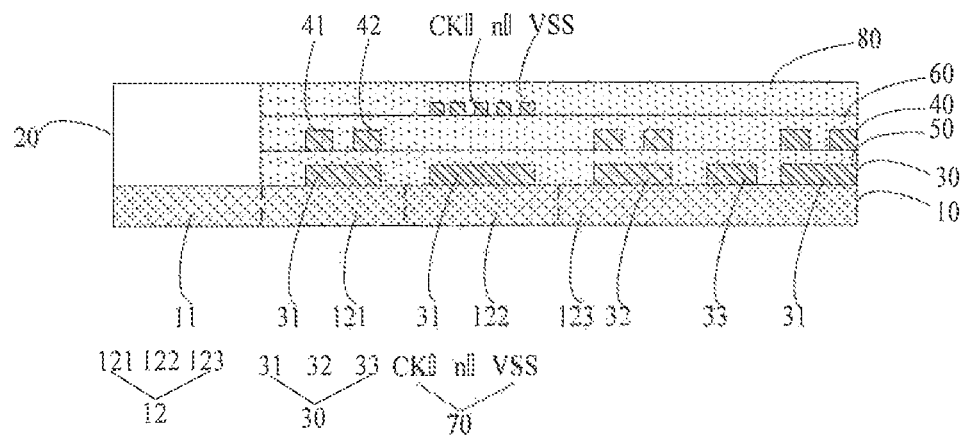
FIG. 1 is an overall top perspective view of an array substrate according to an embodiment of the present application.

The embodiments of the present application are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative, and are not to be construed as limiting.

In the description of the present application, it is to be understood that the terms "center", "longitudinal", "transverse", "length", "width", "thickness", "upper", "lower", "front", " "post", "left", "right", "vertical", "horizontal", "top", "bottom", "inside", "outside", "clockwise", "counterclockwise", etc. refer to positional relationship based on the orientational or positional relationship shown in the drawings, and are merely for the convenience of describing the present application and the simplified description, and do not indicate or imply that the device or component referred to has a specific orientation, and is constructed and operated in a specific orientation. Therefore, it should not be construed as limiting the application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present application, the meaning of "plurality" is two or more, unless specifically defined otherwise.

Figure 2:
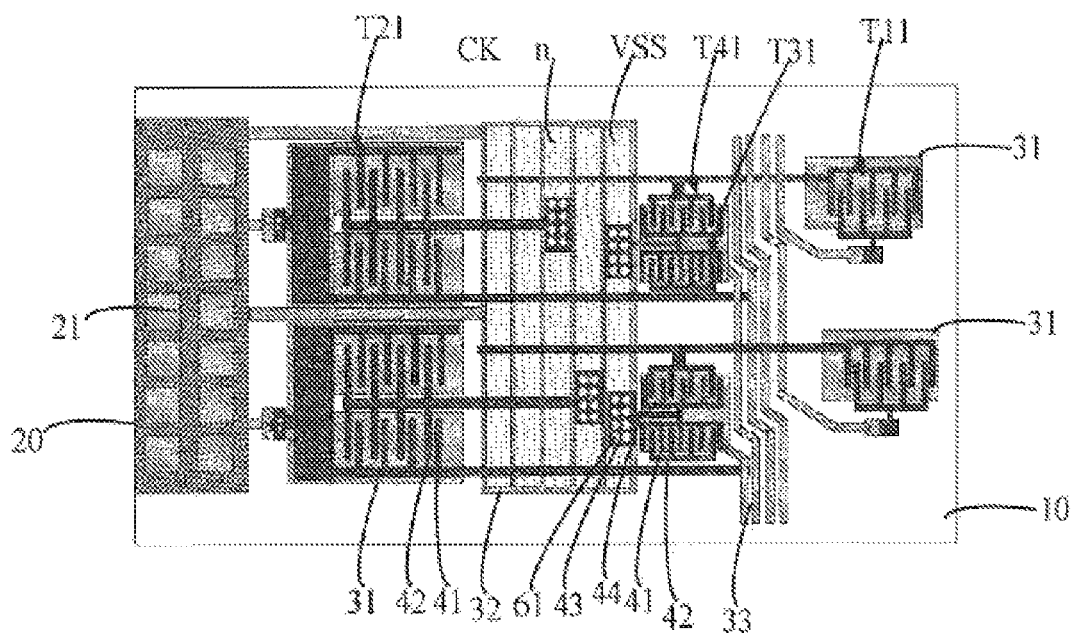
FIG. 2 is a schematic structural diagram of an array substrate according to an embodiment of the present application.
Figure 3:
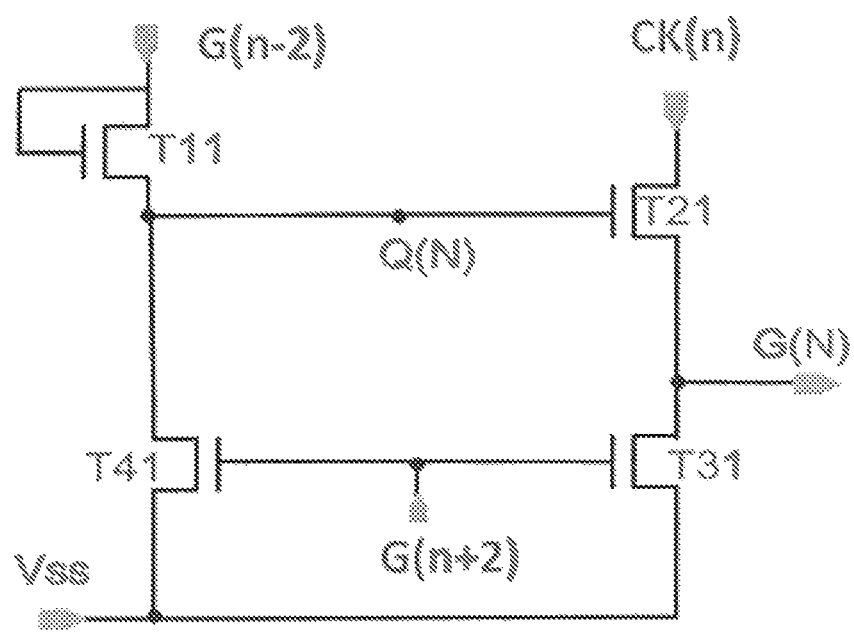
FIG. 3 is a schematic circuit diagram of a gate driver on array (GOA) driving unit of an array substrate according to an embodiment of the present application.

Please refer to FIG. 1, FIG. 2, and FIG. 3 at the same time, FIG. 1 is an overall top perspective view of an array substrate according to an embodiment of the present application; FIG. 2 is a schematic structural diagram of an array substrate according to an embodiment of the present application; FIG. 3 is a schematic circuit diagram of a gate driver on array (GOA) driving unit of an array substrate according to an embodiment of the present application. The present invention provides an array substrate provided with a light emitting display unit 20 and a gate driver on array (GOA) driving circuit for driving the light emitting display unit 20. The light emitting display unit 20 comprises a plurality of pixel units 21 arranged in an array. The GOA drive circuit comprises a multi-stage GOA drive unit. Each stage of the GOA drive unit comprises a plurality of thin film transistors.

As shown in FIG. 3, the plurality of thin film transistors comprise a first thin film transistor T11, a second thin film transistor T21, a third thin film transistor T31, and a fourth thin film transistor T41. A source of the first thin film transistor T11 is electrically connected to a gate of the second thin film transistor T21 and a drain of the fourth thin film transistor T41; a gate of the third thin film transistor T31 is electrically connected to a gate of the fourth thin film transistor T41; a source of the second thin film transistor T21 is electrically connected to a drain of the third thin film transistor T31; a source of the third thin film transistor T31, a source of the fourth thin film transistor T41, and the low voltage level signal line VSS are electrically connected; and a drain of the second thin film transistor T21 is electrically connected to a clock signal line CK(n).

Wherein, the array substrate comprises a substrate 10, the light emitting display unit 20, a first metal layer 30, a first insulating layer 50, a second metal layer 40, a second insulating layer 60, a third metal layer 70, and a flat layer 80 on a structural level.

Wherein, the substrate 10 comprises a display region 11 and a non-display region 12, and the light-emitting display unit 20 is disposed in the display region 11. The light emitting display unit 20 is a liquid crystal light emitting layer or an organic light emitting diode (OLED) light emitting layer in the related art. The non-display region 12 comprises a first region 121, a second region 122, and a third region 123 that are sequentially connected side by side. The first region 121 is located between the second region 122 and the display region 11.

Wherein, the first metal layer 30 is disposed on the substrate 10 and forms a gate metal 31 on the first region 121 and the third region 123 and a common line 32 on the second region. The gate metal 31 comprises gates of the plurality of thin film transistors. Of course, the first metal layer 30 further forms a plurality of scan lines 33 located in the third region 123.

Wherein, the first insulating layer 50 is disposed on the substrate 10 and the first metal layer 30; the first insulating layer 50 is formed by depositing materials such as silicon dioxide or silicon nitride.

Wherein, the second metal layer 40 is disposed on the first insulating layer, and the second metal layer 40 forms a source and drain metal on the first region 121 and the third region 123. The source and drain metal comprises sources 41 and drains 42 of the plurality of thin film transistors. Of course, it is understood that a semiconductor layer is further disposed on the first region and the second region of the substrate for forming a channel of the plurality of thin film transistors, and the plurality of channels, the plurality of sources 41, the plurality of drains 42, and a plurality of gates constitute the plurality of thin film transistors.

Wherein, the second insulating layer 60 is disposed on the first insulating layer 50 and the second metal layer 40. The second insulating layer 60 is formed by depositing materials such as silicon dioxide or silicon nitride.

Wherein, the third metal layer 70 is disposed on the second insulating layer 60. The third metal layer 70 comprises a plurality of spaced-apart voltage signal lines 71 located above the second region 123. The voltage signal lines 71 extend in the same direction as the common line, and the plurality of voltage signal lines 71 are disposed in parallel. A vertical projection of the plurality of voltage signal lines 71 on the substrate is located in the second region 122. Specifically, the plurality of voltage signal lines 71 comprise the low level signal line VSS and a plurality of clock signal lines CK(n). The number of the plurality of clock signal lines CK(n) is four.

Wherein, the gate, the source, and the drain of the second thin film transistor T21 are located above the first region 121; the gates, the sources and the drains of the first thin film transistor T11, the third thin film transistor T31, and the fourth thin film transistor T41 are located above the third region 123.

Wherein, the second metal layer 40 comprises a plurality of connection traces 44 and a plurality of connecting metal blocks 43, each of the connecting metal blocks 43 is respectively disposed above one of the voltage signal lines 71, one end of the connection traces 44 is electrically connected to the connection metal block 43, and the other end of the connection trace 44 is electrically connected to a drain 42. Specifically, a first metallized hole 61 is disposed on a position of the second insulating layer 60 corresponding to the first connecting metal block 43, and the first metallized hole 61 is used to electrically connect the connecting metal block 43 to a corresponding voltage signal line 71. Preferably, each of the connecting metal blocks 43 is electrically connected to the corresponding voltage signal line 71 through the first metallized holes 61 arranged in the plurality of arrays.

In the present application, by placing a plurality of voltage signal lines above the region where the common line is located, thereby avoiding the position in the horizontal direction required when the common line and the voltage signal line are disposed on the same layer, thereby reducing the non-display region. Size, improve the screen's beneficial effect.

The present application also provides a display panel using the array substrate in any of the above embodiments.

In the above, although the present application has been disclosed in the above preferred embodiments, the above-described preferred embodiments are not intended to limit the application, and those skilled in the art can make various changes and retouching without departing from the spirit and scope of the present application. Hence, the scope of protection of this application is subject to the scope defined by the claims.

What is claimed is:

1. An array substrate provided with a gate driver on array (GOA) driving circuit, wherein the GOA driving circuit comprises a plurality of thin film transistors, and the array substrate comprises:
   a substrate comprising a display region and a non-display region, wherein the non-display region comprises a first region, a second region, and a third region that are sequentially connected side by side, and the first region is located between the second region and the display region;
   a first metal layer disposed on the substrate and forming a gate metal on the first region and the third region and a common line on the second region, wherein the gate metal comprises gates of the plurality of thin film transistors;

a first insulating layer disposed on the substrate and the first metal layer;

a second metal layer disposed on the first insulating layer and forming a source and drain metal on the first region and the third region, wherein the source and drain metal comprises sources and drains of the plurality of thin film transistors;

a second insulating layer disposed on the first insulating layer and the second metal layer; and a third metal layer disposed on the second insulating layer and forming a plurality of spaced-apart voltage signal lines located above the second region;

wherein the voltage signal lines extend in a same direction as the common line, the voltage signal lines are disposed in parallel, and a vertical projection of the voltage signal lines on the substrate is located in the second region;

wherein the first metal layer further forms a plurality of scan lines located in the third region;

wherein the second metal layer further forms a plurality of connection traces and a plurality of connecting metal blocks, each of the connecting metal blocks is respectively disposed above one of the voltage signal lines, one end of the connection traces is electrically connected to the connecting metal blocks, and another end of the connection traces is electrically connected to the drains; and a first metallized hole disposed on a position of the second insulating layer corresponding to the first connecting metal blocks, and the first metallized hole is used to electrically connect the connecting metal blocks to corresponding voltage signal lines.

2. The array substrate of claim 1, wherein the plurality of voltage signal lines comprise a low voltage level signal line and a plurality of clock signal lines.

3. The array substrate of claim 2, wherein a number of the plurality of clock signal lines is four.

4. The array substrate of claim 2, wherein the plurality of thin film transistors comprise a first thin film transistor, a second thin film transistor, a third thin film transistor, and a fourth thin film transistor;

a source of the first thin film transistor is electrically connected to a gate of the second thin film transistor and a drain of the fourth thin film transistor, a gate of the third thin film transistor is electrically connected to a gate of the fourth thin film transistor, a source of the second thin film transistor is electrically connected to a drain of the third thin film transistor, a source of the third thin film transistor, a source of the fourth thin film transistor, and the low level signal line are electrically connected, and a drain of the second thin film transistor is electrically connected to the clock signal lines.

5. The array substrate of claim 4, wherein the gate, the source, and the drain of the second thin film transistor are located above the first region, and the gate, the source and the drain of the first thin film transistor, the third thin film transistor, and the fourth thin film transistor are located above the third region.

6. The array substrate of claim 1, wherein each of the connecting metal blocks is electrically connected to the corresponding voltage signal lines through the first metallized hole arranged in a plurality of arrays.

7. An array substrate provided with a gate driver on array (GOA) driving circuit, wherein the GOA driving circuit comprises a plurality of thin film transistors, and the array substrate comprises:

a substrate comprising a display region and a non-display region, wherein the non-display region comprises a first region, a second region, and a third region that are sequentially connected side by side, and the first region is located between the second region and the display region;

a first metal layer disposed on the substrate and forming a gate metal on the first region and the third region and a common line on the second region, wherein the gate metal comprises gates of the plurality of thin film transistors;

a first insulating layer disposed on the substrate and the first metal layer;

a second metal layer disposed on the first insulating layer and forming a source and drain metal on the first region and the third region, wherein the source and drain metal comprises sources and drains of the plurality of thin film transistors;

a second insulating layer disposed on the first insulating layer and the second metal layer; and a third metal layer disposed on the second insulating layer and forming a plurality of spaced-apart voltage signal lines located above the second region, wherein the second metal layer further forms a plurality of connection traces and a plurality of connecting metal blocks, each of the connecting metal blocks is respectively disposed above one of the voltage signal lines, and one end of the connection traces is electrically connected to the connection metal block, and the other end of the connection trace is electrically connected to a drain; and a first metallized hole disposed on a position of the second insulating layer corresponding to the first connecting metal blocks, and the first metallized hole is used to electrically connect the connecting metal blocks to corresponding voltage signal lines.

8. The array substrate of claim 7, wherein the voltage signal lines extend in a same direction as the common line, the voltage signal lines are disposed in parallel, and a vertical projection of the voltage signal lines on the substrate is located in the second region.

9. The array substrate of claim 7, wherein the plurality of voltage signal lines comprise a low level signal line and a plurality of clock signal lines.

10. The array substrate of claim 9, wherein a number of the plurality of clock signal lines is four.

11. The array substrate of claim 9, wherein the plurality of thin film transistors comprise a first thin film transistor, a second thin film transistor, a third thin film transistor, and a fourth thin film transistor;

a source of the first thin film transistor is electrically connected to a gate of the second thin film transistor and a drain of the fourth thin film transistor, a gate of the third thin film transistor is electrically connected to a gate of the fourth thin film transistor, a source of the second thin film transistor is electrically connected to a drain of the third thin film transistor, a source of the third thin film transistor, a source of the fourth thin film transistor, and the low level signal line are electrically connected, and a drain of the second thin film transistor is electrically connected to the clock signal lines.

12. The array substrate of claim 11, wherein the gate, the source, and the drain of the second thin film transistor are located above the first region, and the gate, the source and the drain of the first thin film transistor, the third thin film transistor, and the fourth thin film transistor are located above the third region.

13. The array substrate of claim 7, wherein each of the connecting metal blocks is electrically connected to the corresponding voltage signal lines through the first metallized holes arranged in a plurality of arrays.

14. The array substrate of claim 7, wherein the first metal layer further forms a plurality of scan lines located in the third region.

15. A display panel comprising an array substrate, wherein the array substrate is provided with a gate driver on array (GOA) driving circuit, the GOA driving circuit comprises a plurality of thin film transistors, and the array substrate comprises:
   a substrate comprising a display region and a non-display region, wherein the non-display region comprises a first region, a second region, and a third region that are sequentially connected side by side, and the first region is located between the second region and the display region;
   a first metal layer disposed on the substrate and forming a gate metal on the first region and the third region and a common line on the second region, wherein the gate metal comprises gates of the plurality of thin film transistors;
   a first insulating layer disposed on the substrate and the first metal layer;
   a second metal layer disposed on the first insulating layer and forming a source and drain metal on the first region and the third region, wherein the source and drain metal comprises sources and drains of the plurality of thin film transistors;
   a second insulating layer disposed on the first insulating layer and the second metal layer; and
   a third metal layer disposed on the second insulating layer and forming a plurality of spaced-apart voltage signal lines located above the second region,
   wherein the second metal layer further forms a plurality of connection traces and a plurality of connecting metal blocks, each of the connecting metal blocks is respectively disposed above one of the voltage signal lines, and one end of the connection traces is electrically connected to the connection metal block, and the other end of the connection trace is electrically connected to a drain; and
   a first metallized hole disposed on a position of the second insulating layer corresponding to the first connecting metal blocks, and the first metallized hole is used to electrically connect the connecting metal blocks to corresponding voltage signal lines.

16. The display panel of claim 15, wherein the voltage signal lines extend in a same direction as the common line, the voltage signal lines are disposed in parallel, and a vertical projection of the voltage signal lines on the substrate is located in the second region.

17. The display panel of claim 15, wherein the plurality of voltage signal lines comprise a low level signal line and a plurality of clock signal lines.

18. The display panel of claim 17, wherein a number of the plurality of clock signal lines is four.

* * * * *